United States Patent
Hayata et al.

(10) Patent No.: US 6,762,848 B2
(45) Date of Patent: Jul. 13, 2004

(54) OFFSET MEASUREMENT METHOD, TOOL POSITION DETECTION METHOD AND BONDING APPARATUS

(75) Inventors: Shigeru Hayata, Tachikawa (JP); Ryuichi Kyomasu, Kodaira (JP); Satoshi Enokido, Hachioji (JP); Toshiaki Sasano, Sagamihara (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 441 days.

(21) Appl. No.: 09/800,323

(22) Filed: Mar. 6, 2001

(65) Prior Publication Data

US 2001/0042770 A1 Nov. 22, 2001

(30) Foreign Application Priority Data

Mar. 6, 2000 (JP) ........................................ 2000-059843

(51) Int. Cl.⁷ .............................................. G01B 11/14
(52) U.S. Cl. ........................ 356/614; 356/622; 228/105; 29/833
(58) Field of Search ................................ 356/614, 620, 356/621, 623; 700/114, 57, 59, 58; 228/105, 104; 156/358.36; 29/833

(56) References Cited

U.S. PATENT DOCUMENTS

| | | | | | |
|---|---|---|---|---|---|
| 4,980,971 A | * | 1/1991 | Bartschat et al. | .............. | 29/833 |
| 5,541,834 A | * | 7/1996 | Tomigashi et al. | ............. | 700/59 |
| 5,702,049 A | * | 12/1997 | Biggs et al. | ................. | 228/105 |
| 5,803,341 A | * | 9/1998 | Abe | ............................ | 228/102 |
| 6,187,121 B1 | * | 2/2001 | Hong et al. | .................... | 156/64 |
| 6,449,516 B1 | * | 9/2002 | Kyomasu et al. | .............. | 700/58 |
| 6,464,126 B2 | * | 10/2002 | Hayata et al. | ............... | 228/105 |
| 6,467,673 B2 | * | 10/2002 | Enokido et al. | ............. | 228/105 |
| 6,542,783 B2 | * | 4/2003 | Takahashi et al. | ............ | 700/58 |
| 2001/0011669 A1 | * | 8/2001 | Hayata et al. | ............... | 228/103 |
| 2001/0016062 A1 | * | 8/2001 | Enokido et al. | ............ | 382/152 |
| 2003/0030821 A1 | * | 2/2003 | Hayata et al. | ............... | 356/622 |

FOREIGN PATENT DOCUMENTS

JP        S59-69939        4/1984

* cited by examiner

*Primary Examiner*—Ho Q. Pham
(74) *Attorney, Agent, or Firm*—Koda & Androlia

(57) ABSTRACT

In measuring the position of a bonding tool accurately in offset correction in a bonding apparatus, the tool is moved to approach a reference member, the tool is illuminated with a reference pattern by a laser diode, and the deviation between the reference member and tool in one horizontal direction is measured based upon the image of the reference pattern projected on the tool. A position detection camera images the tool in another horizontal direction, thus measuring the deviation of the tool and reference member. The position detection camera is moved to approach the reference member, and the deviation between the position detection camera and the reference member is measured by the position detection camera. The accurate offset amounts between the position detection camera and the tool are determined based upon these measured values and amounts of movement of the position detection camera and the tool.

4 Claims, 13 Drawing Sheets

OFFSET MEASUREMENT METHOD, TOOL POSITION DETECTION METHOD AND BONDING APPARATUS

BACKGROUND OF THE INVENTION

1. Field of the Invention

The present invention relates to an offset measurement method, a tool position detection method and a bonding apparatus. More specifically, the present invention relates to a method and apparatus that allows the accurate calculation of the amount of offset between a position detection imaging device and a processing member such as a tool.

2. Prior Art

In bonding apparatuses, such as a wire bonding apparatus, a bonding head is mounted on an XY table. On this bonding head, a position detection camera and a bonding arm are provided. The position detection camera is used to image a reference pattern on objects to be bonded such as semiconductor devices, etc. in order to specify the bonding points on these objects to be bonded. The bonding arm has a tool on its one end so that the tool performs bonding on the objects to be bonded. The position detection camera and the tool are installed so that the optical axis of the position detection camera and the axial center of the tool are shifted by a fixed distance. This arrangement is made so that the tool and bonding arm do not interfere with the visual field of the position detection camera when the position detection camera images the reference pattern on the object to be bonded. Generally, the distance or the between the optical axis of the position detection camera and the axial center of the tool is referred to as the "offset".

Since the position detection camera determines the reference point that is used in order to ascertain the position to which the tool is moved, it is extremely important to ascertain exactly how far the position detection camera is offset from the tool. However, since the actual amount of offset varies from instant to instant as a result of thermal expansion of the camera holder and bonding arm caused by radiant heat from the high-temperature bonding stage, the amount of offset must be corrected at the time that bonding work is initiated and with an appropriate timing during the bonding work.

For this purpose, Japanese Patent Application Laid-Open (Kokai) No. S59-69939, for instance, discloses a method that corrects the amount of offset. In this method, a pressure mark is formed by a tool at a suitable location within a bonding range, the position of the tool is detected by a position detection camera to detect the position of pressure mark, and the amount of offset is corrected based upon this position. In this method, the center coordinates of the pressure mark are determined by performing specified image processing on image data obtained by photoelectric conversion from the position detection camera, and the amount of offset is calculated based upon these coordinates.

However, in the above-described conventional construction, the pressure marks of the tool are not always distinct. Furthermore, unlike cases in which a special pattern suitable for image processing is used, the shapes of the individual pressure marks differ from each other. Thus, detection is not always accurate.

BRIEF SUMMARY OF THE INVENTION

The present invention solves the above-described problems.

The object of the present invention is to provide a novel means that accurately detects the position of a bonding tool.

The above object is accomplished by the unique structure for a bonding apparatus and an offset method that is used in such a bonding apparatus that is comprised of:
   a position detection imaging device which images an object to be processed, and
   a tool which is installed at an off set position with respect to the position detection imaging device,
   and in the present invention:
      a reference pattern is projected toward the tool at a specified angle of inclination with respect to a measurement direction from a light source that is disposed in a specified position,
      the position of the tool is measured based upon the reference pattern projected on the tool,
      the position of the position detection imaging device is measured, and
      the amount of offset between the position detection imaging device and the tool is determined based upon these measurement results.

In the present invention, the reference pattern is projected on the tool (bonding tool) at a specified angle of inclination with respect to the measurement direction from the light source disposed in a specified position, and the position of the tool is measured based upon the reference pattern that is projected on the tool. Thus, since the reference pattern projected on the tool is detected with a position and shape that differs according to the position of the tool, the position of the tool is accurately detected based upon such detected different positions and shapes.

Furthermore, the position of the position detection imaging device (a position detection camera) is measured by imaging the specified reference point by the position detection imaging device. Accordingly, the position detection imaging device that is used to image the object to be processed can be used to measure offset amounts.

In the present invention, a reference member disposed in a specified position is used as the reference point. Also, the projection of the reference pattern onto the tool and the measurement of the position of the tool are both accomplished in an attitude in which the tool is caused to approach the reference member. In addition, when the amount of offset between the position detection imaging device and the tool is determined, the amounts of movement of the position detection imaging device and tool between an attitude in which the position of the tool is measured and an attitude in which the reference point is imaged by the position detection imaging device can be specified. As a result, the position of the tool and the measurement of the position of the position detection imaging device is measured with great accuracy because of the use of the reference member.

Furthermore, in the present invention, it is possible so set so that the reference pattern is projected on both the tool and the reference member from the light source and that the position of the tool is measured based upon the image light from the tool and the reference member. As a result, the positional relationship between the reference member and the tool can be determined with good precision based upon the positional relationship between the tool and the light source and upon the positional relationship between the reference member and the light source.

In the present invention, when the position of the tool is measured, it is possible to design so that an image light from the tool and the reference member is conducted to the position detection imaging device. With this structure, the position detection imaging device that is used to image the object to be processed can be used not only for detecting the position of the position detection imaging device but also for detecting the position of the tool.

In addition, the measurement of the position of the tool can use two measured values. One is that which is obtained by measuring the position of the tool based upon the reference pattern projected on the tool. The other is that which is obtained by conducting image light from the tool and the reference member to the position detection imaging device and then measuring the positional relationship between the tool and the reference member by the position detection imaging device. In this way, the tool position can be measured more accurately.

The present invention further provides a method for detecting the position of a tool that processes an object to be processed. This method of the present invention comprises:

a step in which a reference pattern is projected on the tool and a reference member disposed in a specified position from a light source disposed in a specified position, and a step in which the position of the tool is measured based upon the reference pattern projected on the tool and the reference member.

In this method, the reference pattern is projected on both the tool and the reference member, and the position of the tool is measured based upon the reference pattern projected on the tool and the reference member. Accordingly, the positional relationship between the reference member and the tool is determined with good precision based upon both the positional relationship between the tool and the light source and the positional relationship between the reference member and the light source.

DETAILED DESCRIPTION OF THE INVENTION

Figure 1:
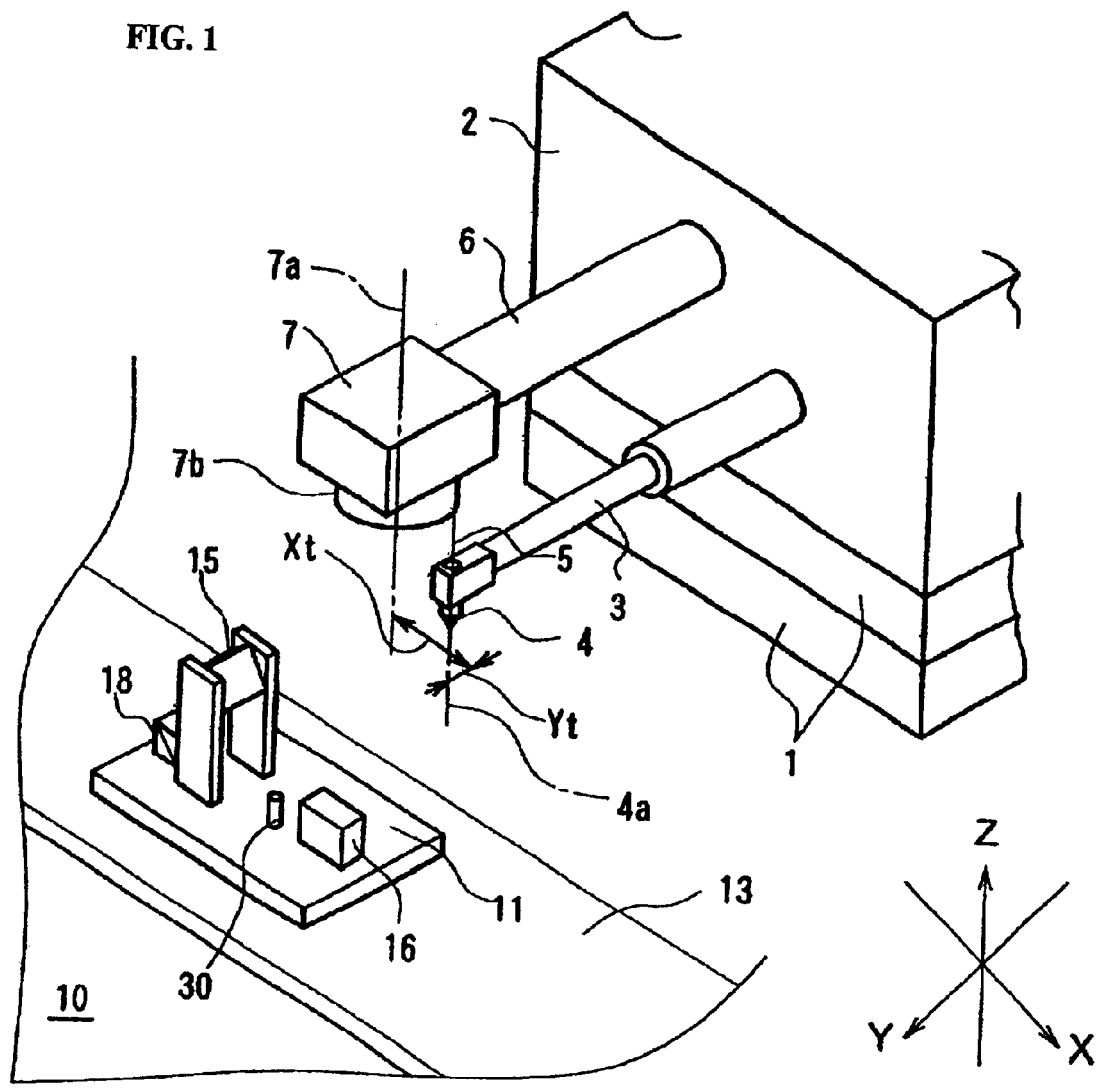
FIG. 1 is a perspective view of the essential portions of a bonding apparatus in accordance with the first embodiment of the present invention.

FIG. 1 shows the wire bonding apparatus according to the first embodiment of the present invention.

As seen from FIG. 1, a bonding arm 3 is installed on a bonding head 2 which is mounted on an XY table 1. The bonding arm 3 is driven in the vertical direction (i.e., the Z direction) by a vertical driving means (not shown). A bonding tool (merely called "tool") 4 is attached to the tip end of the bonding arm 3, and a wire 5 is passed through this tool 4. A camera holder 6 is fastened to the bonding head 2, and a position detection camera 7 which is a photoelectric transducer type imaging device equipped with a charge-coupled device (CCD) is mounted on the tip end of the camera holder 6. The optical axis 7a of the position detection camera 7 and the axial center 4a of the tool 4 are both oriented perpendicularly in the vertical direction, i.e., in the Z direction. The optical axis 7a and the axial center 4a are offset in the X and Y directions by offset amounts Xt and Yt. The XY table 1 is accurately moved in the X and Y directions by two pulse motors (not shown) installed in the vicinity of the XY table 1. As a result, the position detection camera 7 and tool 4 are moved in the X and Y directions in an integral fashion while maintaining the offset amounts Xt and Yt. These structures are known in prior art.

A rail 13 is installed in the vicinity of a bonding stage 10 that positions and carries a semiconductor device (not shown). A reference stand 11 on which a reference member 30 is installed in an upright position is fastened to the upper surface of the rail 13. A prism 18, a laser diode 15 which is used as a light source for the reference pattern, and a laser diode 16 which is used as a transmitted-light light source are disposed on the reference stand 11.

Figure 2:
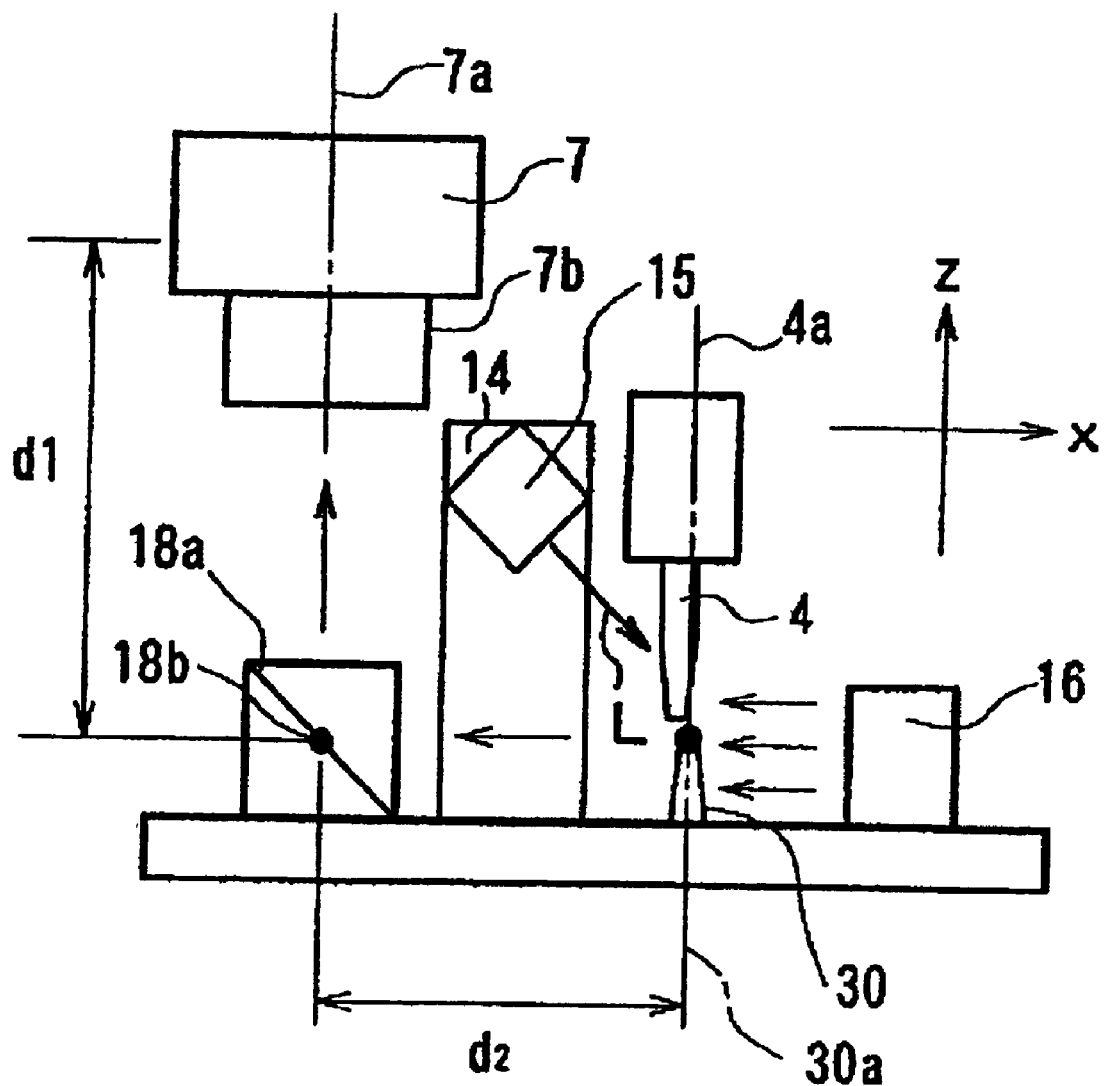
FIG. 2 is a front view thereof.

As seen from FIG. 2, the laser diode 15 is fastened to the upper end of a light source stand 14 installed on the reference stand 11. The laser diode 15 is oriented at an angle of inclination of 45 degrees relative to the horizontal direction, so that the reference pattern L is projected toward the tip end of the tool 4.

Figure 3A:
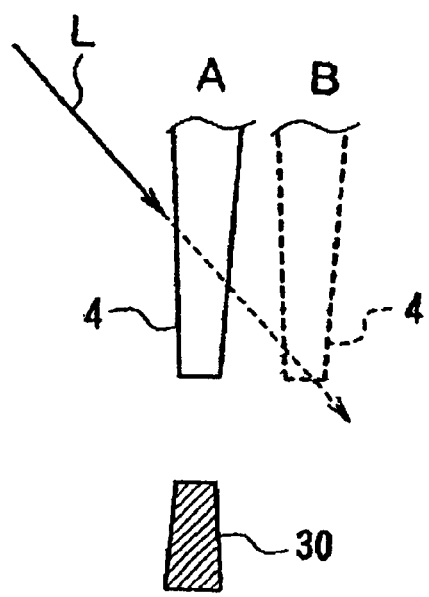
FIG. 3A shows the direction of illumination and the position of the tool.
Figure 3C:
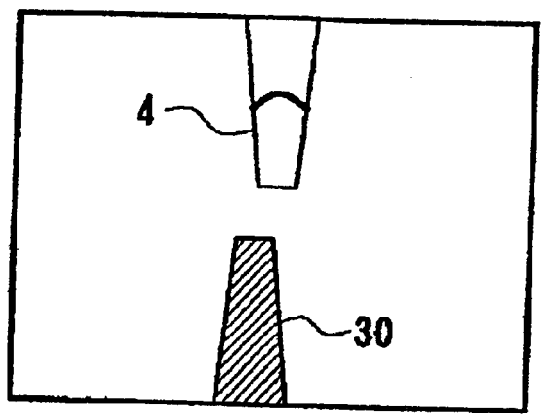
FIGS. 3C and 3D show light images of the tool illuminated by the reference pattern.
Figure 3B:
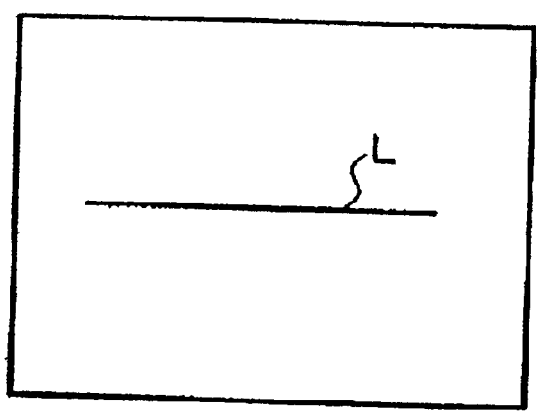
FIG. 3B shows one example of the reference pattern.
Figure 3D:
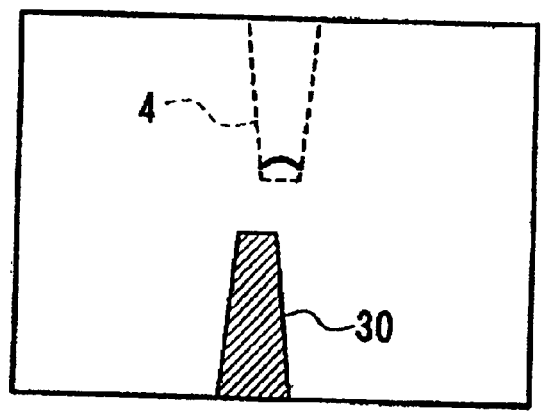

A rectilinear pattern oriented in the horizontal direction such as that shown in FIG. 3B is used as the reference pattern L. Accordingly, when the tool 4 is in position A in FIG. 3A, the reference pattern L is projected on the middle of the tool 4 as shown in FIG. 3C. When the tool 4 is in position B shown in FIG. 3A, the reference pattern L is projected on the area near the lower end of the tool 4 as shown in FIG. 3D. Thus, as a result of the reference pattern L that is projected at an inclined angle with respect to the horizontal direction, the reference pattern L is projected at different height positions depending upon the position of the tool 4 in the X direction.

The laser diode 16 is, as seen from FIG. 2, set so that it directs parallel light toward the reference member 30. The reflective surface 18a of the prism 18 crosses the horizontal direction at an angle of 45°. Accordingly, in an attitude in which the tool 4 is caused to approach the reference member 30, a light image of the lower end of the tool 4 and the upper end of the reference member 30 is conducted to the position detection camera 7 via the reflective surface 18a of the prism 18 as a shadow that is caused by the light of the laser diode 16. A mirror-surface body such as a mirror can be used instead of the prism 18.

The interval d2 between the center 18b of the reflective surface of the prism 18 and the axial center 30a of the reference member 30 is set so that it is substantially equal to the offset amount Xt that is between the optical axis 7a of the position detection camera 7 and the axial center 4a of the tool 4 in the X direction.

The position detection camera 7 has a lens 7b which is a telecentric lens. The term "telecentric lens" refers to a telecentric optical system, i.e., an optical system in which the principal light rays that are focused as an image pass through a focal point on the rear side of the lens. Telecentric lenses have a wide tolerance range for positional deviations in the direction facing the image-focusing plane. They are generally known for the fact that the size of the image (i.e., the distance from the optical axis) does not change even if the object position fluctuates, especially in cases where an object of imaging is illuminated by transmitted light that is parallel light. Such lenses are used in various types of industrial measuring instruments; and telecentric lenses or optical systems that have characteristics that are similar to telecentric are widely used in bonding apparatuses as well.

Figure 4:
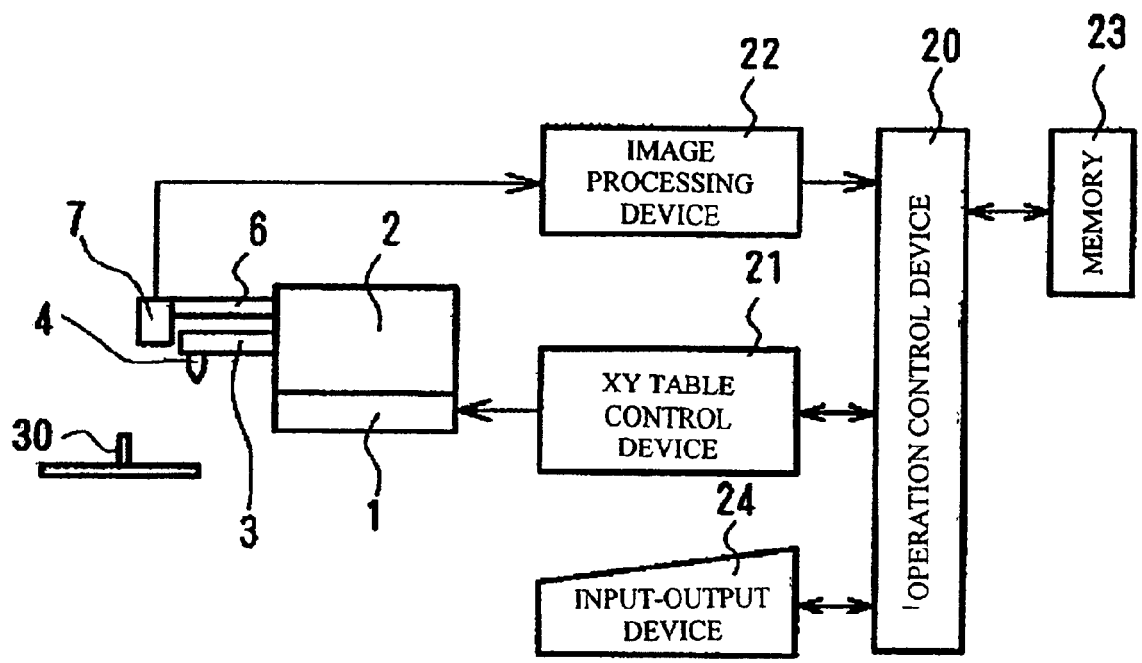
FIG. 4 is a block diagram of the control system of the first embodiment.

As shown in FIG. 4, the XY table 1 is driven by commands from an operation control device 20 via an XY table control device 21. The image acquired by the position detection camera 7 is converted into an electrical signal and processed by an image processing device 22. Then, the accurate offset amounts Xt and Yt are calculated by the operation control device 20, a computer, using a method that will be described below. Offset amounts Xw and Yw are stored beforehand in a memory 23. Here, when $\Delta X$ and $\Delta Y$ are the differences between the accurate offset amounts Xt and Yt and the offset amounts Xw and Yw that are stored beforehand in the memory 23, i.e., where $\Delta X$ and $\Delta Y$ are the offset correction amounts, then the relationship shown by Numerical Expression 1 exists between these accurate offset amounts Xt and Yt, the offset amounts Xw and Yw stored beforehand in memory, and the offset correction amounts $\Delta X$ and $\Delta Y$. In FIG. 4, the reference numeral 24 is an input-output device.

$$Xt = Xw + \Delta X$$
$$Yt = Yw + \Delta Y \quad \text{Numerical Expression 1}$$

Next, the method for calculating the offset amounts Xt and Yt will be described.

Figure 5:
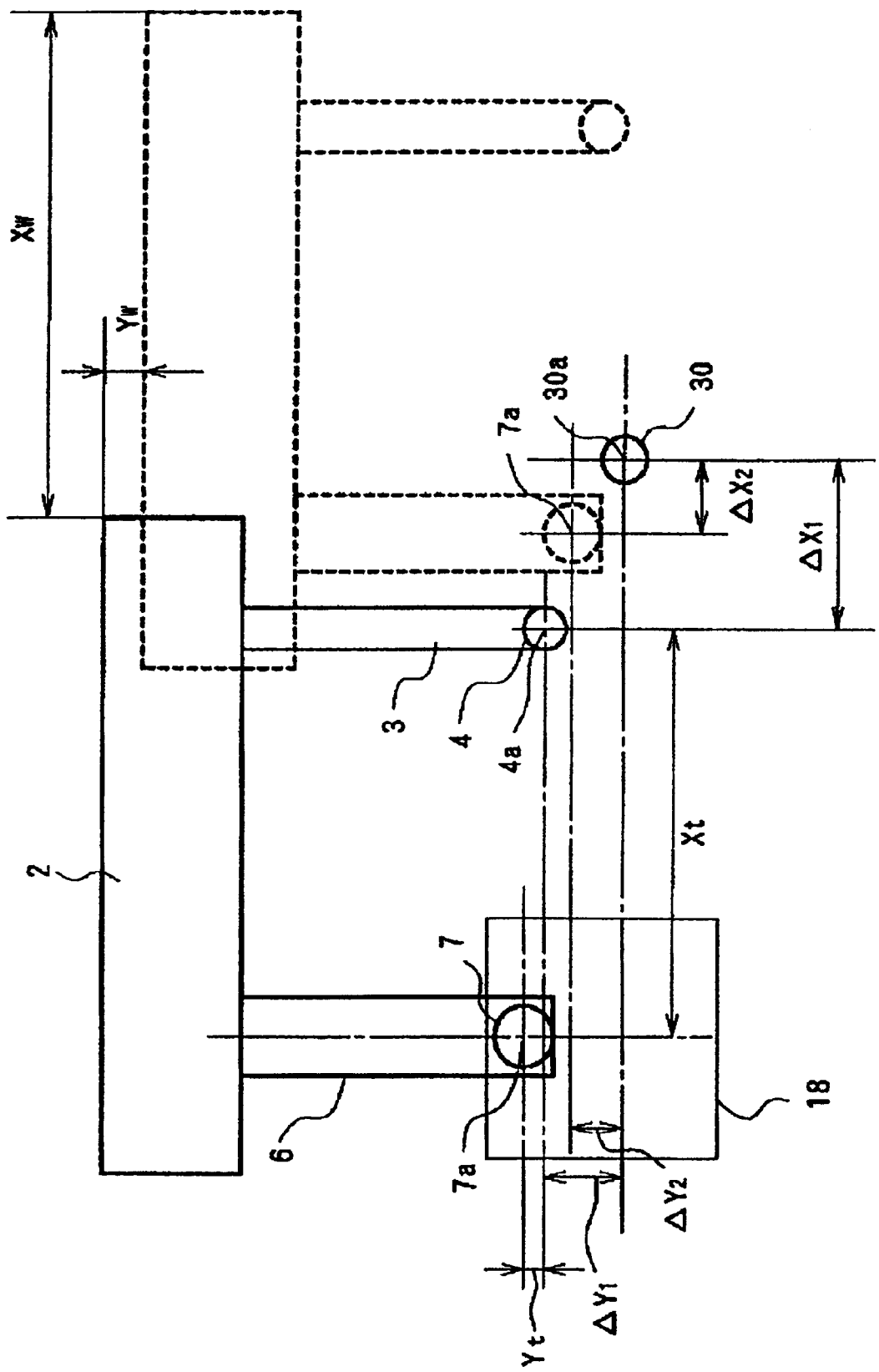
FIG. 5 is a top view showing the layout of the tool, position detection camera and reference member used in offset correction.

First, as indicated by the solid line in FIG. 5, the XY table 1 is driven by a command from the operation control device 20 (FIG. 4) via the XY table control device 21. As a result, the tool 4 is lowered to a height where it almost touches the reference member 30, and the axial center 4a of the tool 4 is caused to be positioned in the vicinity of the reference member 30. Here, it is sufficient if the tool 4 is in position that allows the tool 4 and reference member 30 to be imaged by the position detection camera 7. It is not necessary to cause the axial center 4a of the tool 4 to coincide with the axial center 30a of the reference member 30.

Then, the tool 4 and the reference member 30 are both imaged by the position detection camera 7, and the positional relationship of the tool 4 and the reference member 30, i.e., the values of $\Delta X_1$ and $\Delta Y_1$, is measured.

Figure 6:
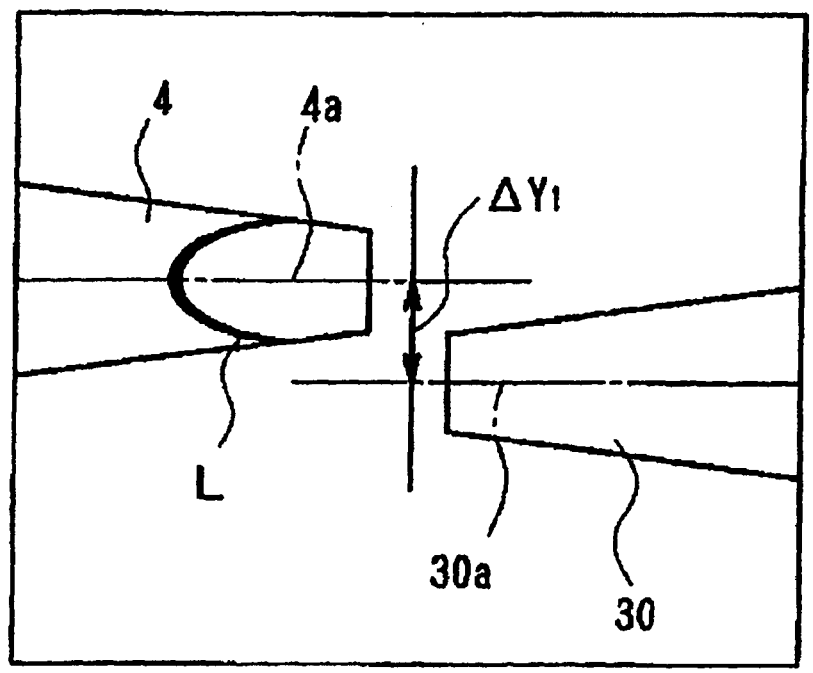
FIG. 6 is an explanatory diagram of the image obtained in an attitude in which the tool is caused to approach the reference member.

As seen from FIG. 2, with the illumination provided by the laser diode 16, the image light of the tool 4 and reference member 30 is reflected by the reflective surface 18a of the prism 18 and conducted to the position detection camera 7 as a shadow with respect to the light of the laser diode 16. As a result, an image such as shown in FIG. 6 is obtained by the position detection camera 7. This image is then subjected to appropriate image processing. Thus, the amount of deviation between the tool 4 and the reference member 30, i.e., the amount of deviation $\Delta Y_1$ between the axial center 4a of the tool 4 and the axial center 30a of the reference member 30, is calculated based upon the positional coordinates of the outlines of the tool 4 and reference member 30.

Meanwhile, as described above, the reference pattern L that is projected from the laser diode 15 is projected at a different height position on the tool 4 according to the position of the tool 4 in the X direction. Accordingly, the amount of deviation $\Delta X_1$ between the axial center 4a of the tool 4 and the axial center 30a of the reference member 30 in the X direction is calculated by subjecting the image shown in FIG. 6 to appropriate image processing based upon the positional coordinates of the outline of the tool and the positional coordinates of the reference pattern.

Figure 7:
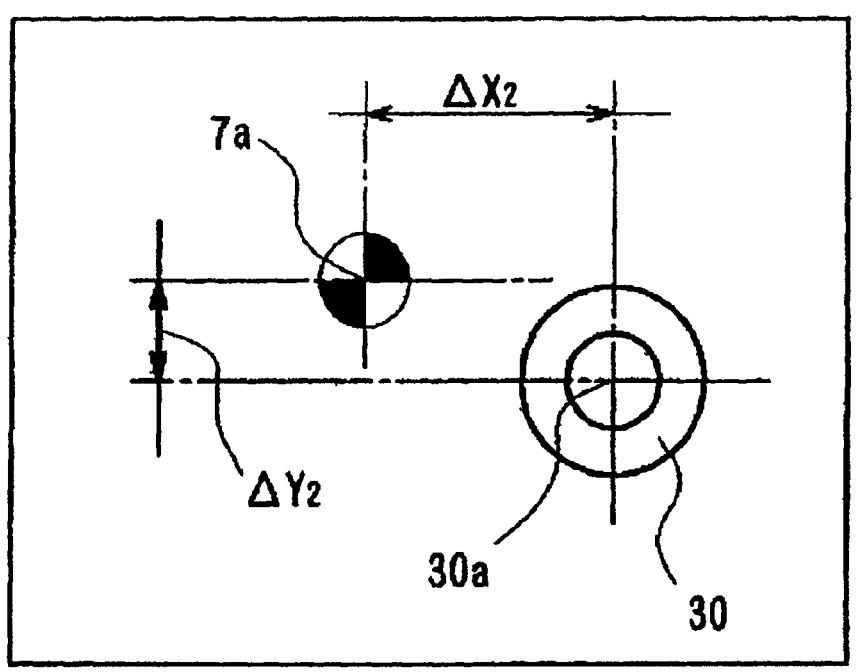
FIG. 7 is an explanatory diagram of the image obtained in an attitude in which the position detection camera is caused to approach the reference member.

When the positional relationship between the tool 4 and the reference member 30, i.e., the values of $\Delta X_1$ and $\Delta Y_1$ are thus measured, the operation control device 20 then drives the XY table 1 via the XY table control device 21. This is done in accordance with the offset amounts Xw and Yw stored beforehand in the memory 23. The position detection camera 7 is, as a result, caused to move to the vicinity of the reference member 30 as indicated by the dotted lines in FIG. 5. Then, in this state, the reference member 30 is imaged (see FIG. 7). This image is subjected to appropriate image processing. The amounts of deviation $\Delta X_2$ and $\Delta Y_2$ between the axial center 30a of the reference member 30 and the optical axis 7a of the position detection camera 7 are thus calculated.

If the offset amounts Xw and Yw stored beforehand in memory are the accurate offset amounts Xt and Yt, then the offset correction amounts $\Delta X$ and $\Delta Y$ are zero. Accordingly, $\Delta X_1$ and $\Delta Y_1$ should agree with $\Delta X_2$ and $\Delta Y_2$. However, if the offset amounts Xw and Yw that are stored beforehand in memory are approximate values, or if the camera holder 6 or bonding arm 3 expands as a result of thermal effects and the offset amounts Xt and Yt vary; then the measured values $\Delta X_1$ and $\Delta Y_1$ do not agree with the measured values $\Delta X_2$ and $\Delta Y_2$, and errors (offset correction amounts) $\Delta X$ and $\Delta Y$ are generated. Accordingly, the offset correction amounts $\Delta X$ and $\Delta Y$ are calculated from the measured values of $\Delta X_1$ and $\Delta Y_1$ and the measured values of $\Delta X_2$ and $\Delta Y_2$ using Numerical Expression 2.

$$\Delta X = \Delta X_1 - \Delta X_2$$
$$\Delta Y = \Delta Y_1 - \Delta Y_2 \quad \text{Numerical Expression 2}$$

In other words, the operation control device 20 calculates the offset correction amounts $\Delta X$ and $\Delta Y$ using Numerical Expression 2. It further calculates the accurate offset amounts Xt and Yt by adding the offset correction amounts $\Delta X$ and $\Delta Y$ to the offset amounts Xw and Yw stored beforehand in memory in accordance with Numerical Expression 1. The operation control device 20 then corrects (updates) the offset amounts Xw and Yw stored in the memory 23 to the accurate offset amounts Xt and Yt. The accurate offset amounts Xt and Yt thus determined are used as new offset amounts Xw and Yw of the position detection camera 7 and tool 4 in subsequent bonding operations.

As seen from the above, in the above embodiment, the reference pattern L is projected toward the tool 4 at an inclined angle with respect to the horizontal direction from the laser diode 15, which is disposed in a specified position. Then, the position of the tool 4 in the X direction is measured based upon the reference pattern L projected on the tool 4. In this operation, the reference pattern L is projected at different height positions according to the positions of the tool 4. The position of the tool 4 in the X direction can be thus accurately detected.

The measurement of the position of the position detection camera 7 is accomplished by imaging the reference member 30 by the position detection camera 7. Thus, the position detection camera 7 that is originally employed so as to be used for imaging semiconductor devices is used for measuring the offset amounts between the tool 4 and the position detection camera 7.

In the shown embodiment, the position of the position detection camera 7 is measured using the reference member 30 as a reference, the position of the tool 4 in the Y direction is measured using the reference member 30 as a reference. Then, based upon these measured values and based upon the offset amounts Xw and Yw stored beforehand in memory (that is the amounts of movement of the position detection camera 7 and tool 4 between the two measurements), the offset amounts between the tool 4 and the position detection camera 7 are determined. In other words, the measurement of the offset amounts is performed with extremely high accuracy using the reference member 30.

Furthermore, the prism 18 is installed which conducts image light from the tool 4 and reference member 30 to the position detection camera 7. Accordingly, the position detection camera 7 can be utilized not only for detecting the position of the position detection camera 7 itself but also for detecting the position of the tool 4.

When determining the position of the tool 4, the above embodiment uses the measured value in the X direction and the measured value in the Y direction. The measured value in the X direction is obtained by measuring the position of the tool 4 based upon the reference pattern L that is projected on the tool 4. The measured value in the Y direction is obtained by conducting image light from the tool 4 and reference member 30 to the position detection camera 7 and then measuring the positional relationship between the tool 4 and the reference member 30 by the position detection camera 7. Accordingly, the measurement in the Y direction, in which the amount of deviation is generally relatively large, can be performed by the image of the outline of the tool 4, which has a relatively broad field of vision. In addition, the measurement in the X direction, in which the amount of deviation is relatively small, can be performed with good precision based upon an image of the reference pattern L.

In the above embodiment, the measurement of the position of the tool 4 in the X direction is performed based upon the reference pattern L projected on the tool 4. Also, the measurement of the position of the tool 4 in the Y direction is performed based upon the image of the outline of the tool 4. Instead, in the present invention, it is possible to measure the position of the tool 4 in both the X and Y directions by way of projecting the reference pattern thereon. In this case, for example, a light source which has a specified angle of inclination with respect to the horizontal direction (similar to the laser diode 15) is installed for the reference member 30 in the Y direction, and the image of the reference member 30 is taken by a camera from the Y direction. Optical members that conduct a light image of the reference member 30 as seen from the Y direction to the position detection camera 7 can be further installed.

In the above embodiment, the direction of illumination of the laser diode 15 is set downward at an inclination with respect to the horizontal direction. Conversely, however, it is also possible to install the laser diode 15 below and to one side of the tool 4 in the measuring attitude, and the tool 4 is illuminated by light oriented upward at an inclination.

Furthermore, in the above embodiment, the direction of illumination of the laser diode 15 is oriented 45° downward with respect to the horizontal direction. However, the direction of illumination of the laser diode 15 may also be set at some other angle of inclination. With a larger angle of inclination, it is possible to obtain a higher measurement precision. Furthermore, in the shown embodiment, the measurement of the amount of deviation of the tool 4 in the X direction is performed based upon a light image of the tool 4 as seen from the horizontal direction. The advantage is that an easy conversion into the X coordinate in image processing is secured. However, if the direction of illumination by the laser diode 15 and the direction of detection of the image differ from each other, the amount of deviation of the tool 4 in the X direction can be measured by the same method. For example, the direction of illumination of the reference pattern L can be set as the horizontal direction, while the measurement of the amount of deviation of the tool 4 in the X direction is accomplished based upon a light image seen from an angle that differs from the horizontal direction.

In the structure of the shown embodiment, the laser diode 15 is fastened to the reference stand 11 via the light source stand 14. However, the laser diode 15 can be disposed in any other desired position. The laser diode 15 can be fastened to the position detection camera 7.

Furthermore, transmitted-light illumination is performed by the laser diode 16 in the above embodiment. However, it is also possible to use reflected light for the measurement of the position of the tool 4 based on an image of the outline of the tool 4. I other words, a light source can be installed inside the position detection camera 7, and the tool 4 is illuminated via the prism 18. The laser diode 16 in the embodiment generates parallel light. However, it is also possible to use a structure in which parallel light is obtained by combining a pinhole and lens with any desired light source. In such a case, for example, an LED (light-emitting diode), halogen lamp, tungsten lamp and emission port of an optical fiber is ideal as a light source. A pinhole may be omitted; however, when a pinhole is not used, the parallel orientation of the light rays tend to deteriorates.

Figure 8A:
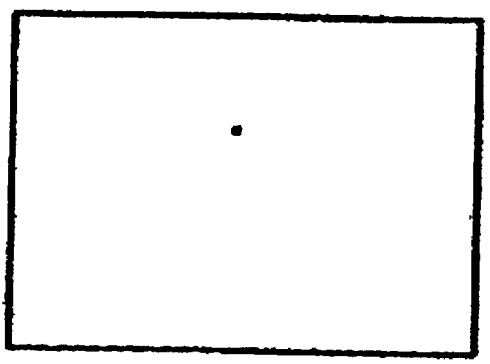
FIGS. 8A through 8E show other examples of the reference patterns.
Figure 8D:
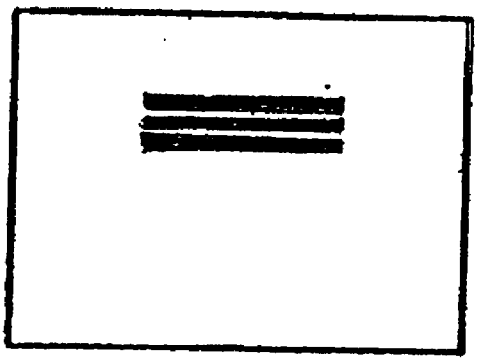
Figure 8B:
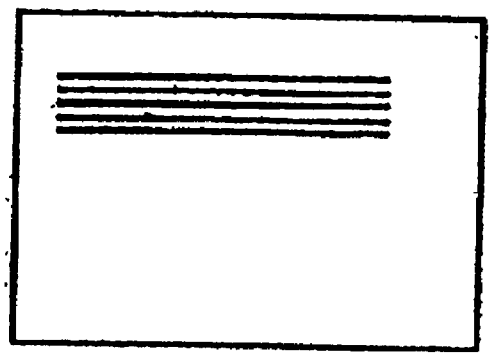
Figure 8E:
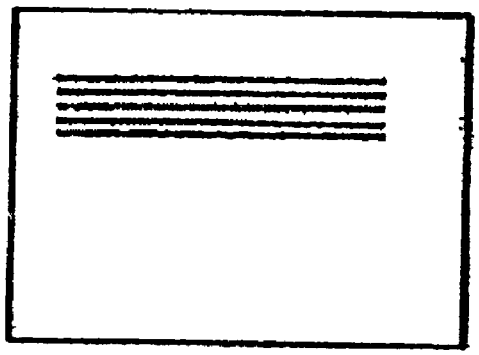
Figure 8C:
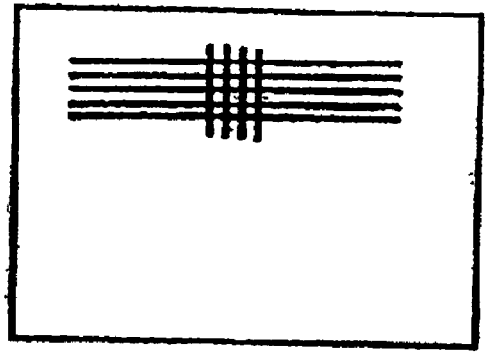

In the above embodiment, the rectilinear pattern oriented in the horizontal direction is used as the reference pattern L. However, some other construction may be used for the reference pattern L. For example, a spot light such as that shown in FIG. 8A, a zebra pattern such as that shown in FIG. 8B, a lattice pattern such as that shown in FIG. 8C or a color pattern such as that shown in FIG. 8E may be used. Furthermore, a sinusoidal pattern such as that shown in FIG. 8D, i.e., a pattern in which the light intensity has a sinusoidal distribution, may also be used. In this case, the effects of scratching or contamination of the surface of the tool 4 can be canceled out, so that precise measurements can be performed, by performing imaging of the illuminated pattern three times with the phase shifted by 120° each time.

In the above embodiment, furthermore, the position detection camera 7 is used for imaging of both the tool 4 and the reference member 30. If the distance from the object to be bonded to the position detection camera 7 is different than the distance from the tool 4 and reference member 30 to the position detection camera 7, the size of the image of the reference member 30 varies. As a result, it is conceivable that correct detection of the positional relationship between the tool 4 and the reference member 30 becomes impossible. In this regard, the position detection camera 7 used in the above embodiment is equipped with the lens 7b consisting of a telecentric lens with characteristics which are such that the size of the image does not vary even if the position of the object of imaging fluctuates. Accordingly, the detection of positional relationships based on such images can be accomplished accurately in all cases.

Furthermore, in the above embodiment, the amounts of deviation of the tool 4 and reference member 30 are measured using images of the tool 4 and reference member 30 captured from the X direction and Y direction, i.e., from angles that differed by 90°. However, the relative angle of the tool 4 and reference member 30 can be other angles and necessarily 90°. The position in which the reference member 30 is installed is not limited to the position shown in the embodiment. It is desirable that this position be as close as possible to the position of an element on which bonding is performed. Furthermore, a projected portion of an element on which bonding is performed (e.g., lead frame) can be utilized as the reference member.

In the above embodiment, furthermore, the tool 4 and position detection camera 7 are moved, and the positional relationship between the position detection camera 7 and reference member 30 is measured after the positional relationship between the tool 4 and reference member 30 is measured. However, these two measurements can be performed in the reverse order, and such steps are included in the scope of the present invention.

Figure 9:
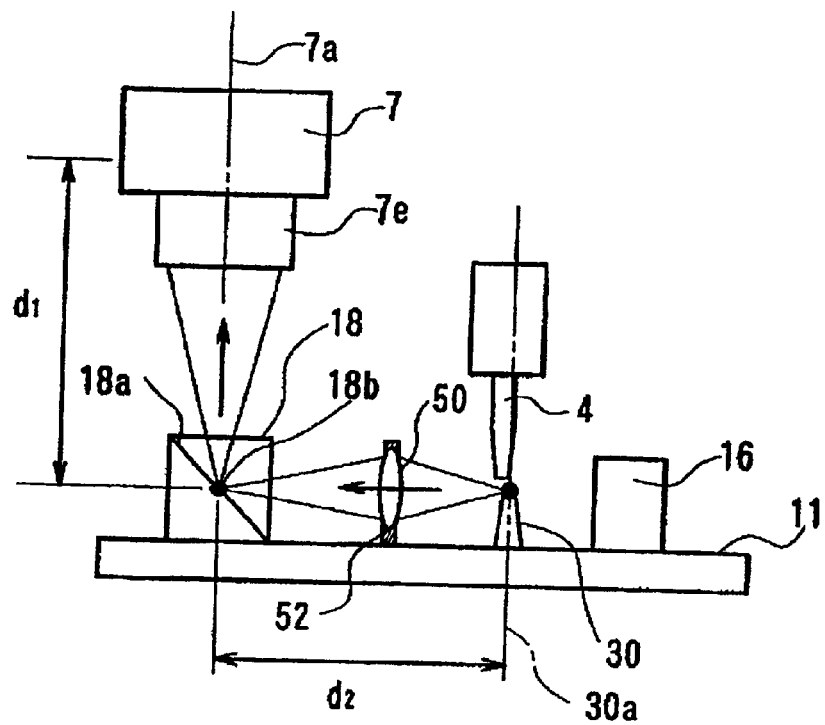
FIG. 9 is a front view which of a modified optical system.

In the above embodiment, the light image of the tool 4 and reference member 30 is conducted "as is" to the position detection camera 7 via the prism 18. A corrective lens 50 can be additionally installed between the prism 18 and reference member 30 as shown in FIG. 9. In the arrangement shown in FIG. 9, the corrective lens 50 is fastened to the reference stand 11 by a corrective lens supporting stand 52. When only the lens 7e is used, the focal position is the center 18b of the reflective surface 18a of the prism 18, which is separated from the image-focusing plane of the position detection camera 7 by a distance of d1. Furthermore, when both the lens 7e and the corrective lens 50 are used, the focal position is the axial center 30a of the reference member 30, which is separated from the image-focusing plane of the position detection camera 7 by a distance of d1+d2. The lens 7e mounted on the position detection camera 7 can be one other than a telecentric lens. Furthermore, though the light source stand 14 and laser diode 15 are disposed as shown in FIG. 2. However, these components are omitted in FIG. 9.

In the arrangement shown in FIG. 9, both the tool 4 and the reference member 30 are imaged by the position detection camera 7 via the corrective lens 50 and prism 18. Since the corrective lens 50 is interposed, the distance to the focal position in this case is d1+d2. Next, the position detection camera 7 is moved so that the camera 7 is caused to approach the reference member 30, and the reference member 30 is directly imaged by the position detection camera 7 in this state. Since the corrective lens 50 is not interposed, the distance to the focal point in this case is d1. Thus, in the structure of FIG. 9, the distance to the focal position is altered by means of the corrective lens 50, which is held as an integral part of the reference stand 11 and therefore of the reference member 30. Accordingly, in the structure of FIG. 9, the corrective lens 50 comes into the light path as a result of the operation that moves the tool 4 and reference member 30 into the imaging attitude. There is no need for an operation that focuses the position detection camera 7 by mechanical or electrical means between the imaging step of both the tool 4 and reference member 30 by the position detection camera 7 and the direct imaging step of the reference member 30 by the position detection camera 7.

Next, a second embodiment will be described.

In the above-described first embodiment, the tool 4 and position detection camera 7 are moved between the measurement of the positional relationship of the tool 4 and the reference member 30 and the measurement of the positional relationship of the position detection camera 7 and the reference member 30, and then the offset amounts are determined by adding the amounts of the movements of the camera 7. This is advantageous in that the offset amounts can be measured very accurately with the use of the reference member 30, which is common reference point for both measurements. However, it is also possible that the tool 4 and the position detection camera 7 are not moved between the two measurements (i.e., a method in which the amount of movement is zero).

Figure 10:
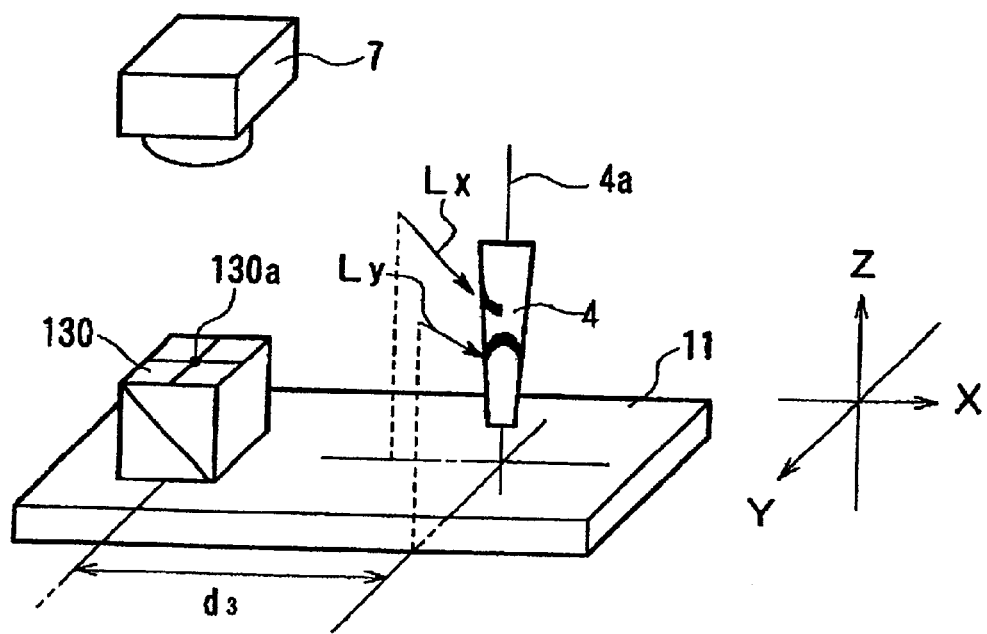
FIG. 10 is a perspective view of the essential portion of the second embodiment of the present invention.

More specifically, as shown in FIG. 10, a prism 130 which has a reference mark 130a formed on its upper surface is installed on the reference stand 11. A light source stand and a laser diode (both not shown) similar to those shown in FIG. 2 are respectively disposed in positions so that the tool 4 is illuminated with references patterns $L_x$ and $L_y$ from the X and Y directions, with the light traveling downward at an inclination, when the position detection camera 7 is positioned directly above the reference mark 130a. The amount of deviation d3 between the reference mark 130a and the imaging reference position of the laser diode 15 in the X direction is equal to the offset amount Xw stored beforehand in memory in the first embodiment, and the amount of deviation in the Y direction is set at zero. A corrective lens similar to the corrective lens 50 shown in FIG. 9 can be installed in the embodiment of FIG. 10.

In the embodiment of FIG. 10, the reference mark 130a is imaged by the position detection camera 7, and the amounts of deviation $\Delta X_1$ and $\Delta Y_1$ are determined by converting this image into an electrical signal and subjecting this signal to image processing. Next, the tool 4 is imaged via the prism 130 by the position detection camera 7 in this state, and the amounts of deviation $\Delta X_2$ and $\Delta Y_2$ are determined by performing image processing based upon the image of the outline of the tool 4 and the image of the reference patterns projected on the tool 4 in the image thus acquired. Then, the accurate offset amounts are calculated from these amounts of deviation and the amounts of deviation between the reference mark 130a and the imaging reference position of the laser diode 15 using the above-described Numerical Expressions 1 and 2.

The embodiment of FIG. 10 is advantageous in that the correction of the offset can be performed quickly. This is because there is no need to move the position detection camera 7 and tool 4 between the measurement of the position of the position detection camera 7 and the measurement of the position of the tool 4. The measurements would include errors of the positional relationship between the reference mark 130a and the imaging reference position of the laser diode 15. However, such errors can be minimized by employing the arrangement that prevents errors in the positional relationship between the two components and by periodically correcting the positional relationship of such components.

Next, the third embodiment of the present invention will be described.

Figure 11A:
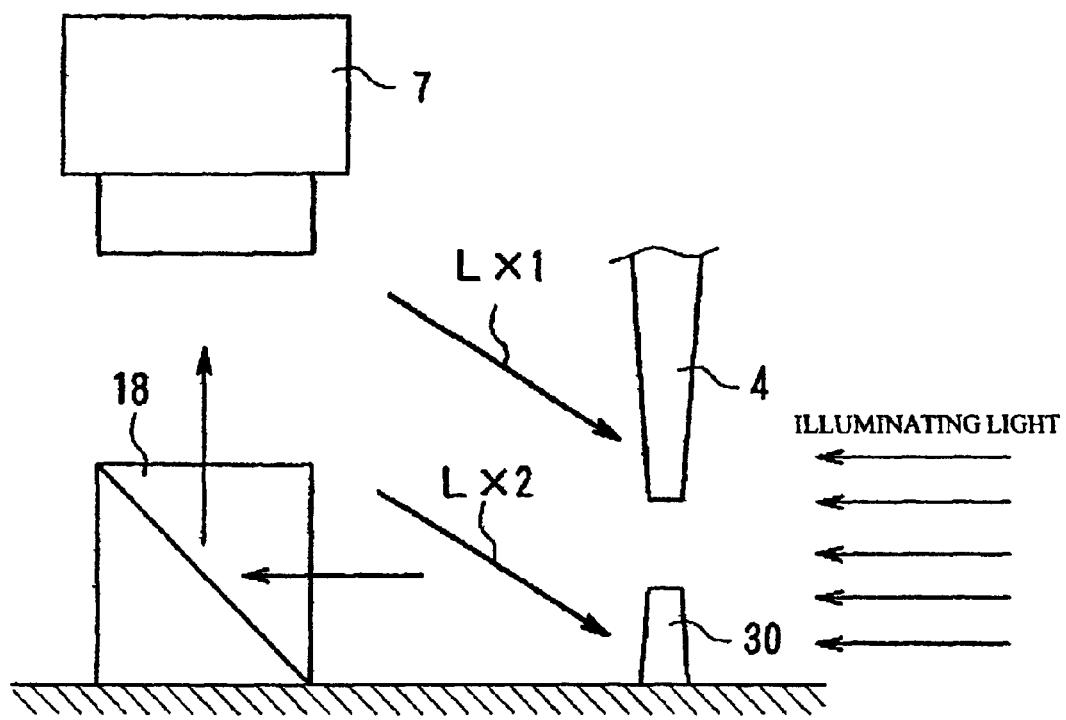
FIG. 11A is a front view of the essential portion of the third embodiment of the present invention showing essential parts.

In this third embodiment, as shown in FIG. 11A, reference patterns $L_{x1}$ and $L_{x2}$ are projected downward at an inclination onto both the tool 4 and reference member 30 from a laser diode (not shown) which constitutes a common light source. The reference patterns $L_{x1}$ and $L_{x2}$ may also be projected from separate light sources. In such a case, however, the spacing and angles of the light sources must be precisely set. A corrective lens similar to the corrective lens 50 shown in FIG. 9 can be used in this embodiment.

Figure 11B:
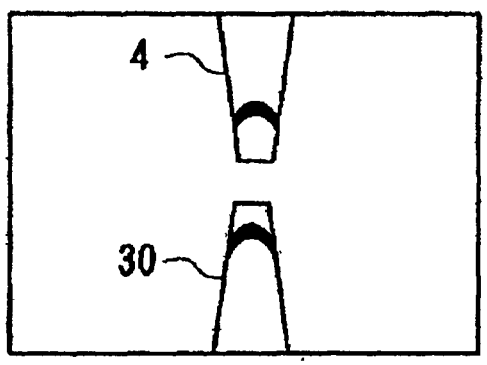
FIG. 11B shows the light image on the tool in the third embodiment.

In the third embodiment, when the tool 4 and reference member 30 are imaged by the position detection camera 7 via the prism 18, an image of the reference pattern $L_{x1}$ projected on the tool 4 and the reference pattern $L_{x2}$ projected on the reference member 30, i.e., an image such as that shown in FIG. 11B, is obtained. The amounts of deviation $\Delta X_2$ and $\Delta X_2$ and $\Delta Y_2$ between the tool 4 and reference member 30 are determined by subjecting this image to image processing, and the accurate offset amounts are calculated based upon these amounts of deviation.

Thus, in the third embodiment, the reference patterns $L_{x1}$ and $L_{x2}$ are projected on both the tool 4 and reference member 30, and the position of the tool 4 is measured based upon these images. Accordingly, the measured value of the positional relationship between the tool 4 and the light source is corrected based upon the positional relationship between the reference member 30 and the light source. The positional relationship between the reference member 30 and the tool 4 is thus determined with much better precision.

Figure 12:
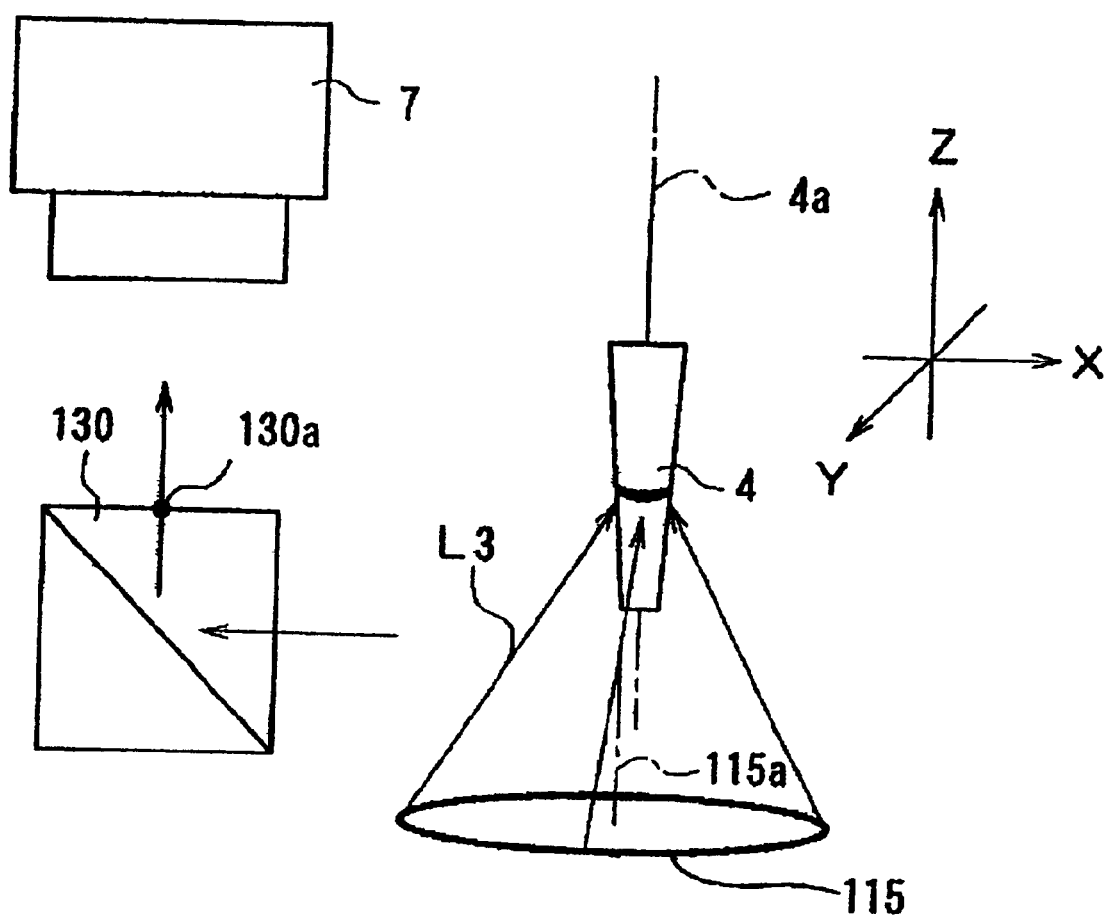
FIG. 12 is an explanatory diagram of the essential portion of the fourth embodiment of the present invention.

Next, the fourth embodiment of the present invention shown in FIG. 12 will be described.

In this fourth embodiment, a prism 130 which has a reference mark 130a similar to that shown in FIG. 10 formed on its upper surface is installed on the reference stand 11. Furthermore, a ring-form light source 115 is installed in a position on the reference stand (not shown) so that the light source surrounds the axial center 4a of the tool 4 when the position detection camera 7 is positioned directly above the reference mark 130a. The ring-form light source 115 is set so that it projects a reference pattern $L_3$ upward at an inclination onto the image reference position, which is the middle position of the tool 4 with respect to the direction of its length, from the entire circumference of the ring-form light source. A corrective lens similar to the corrective lens 50 shown in FIG. 9 can be installed in this fourth embodiment of FIG. 12.

In this structure, the tool 4 is imaged by the position detection camera 7 via the prism 130, image processing is performed on the image of the outline of the tool 4 and the image of reference pattern $L_3$ projected on the tool 4 in the image thus acquired. The amounts of deviation $\Delta X_2$ and $\Delta Y_2$ are thus determined. Then, the accurate offset amounts are calculated based upon these amounts of deviation.

Figure 13A:
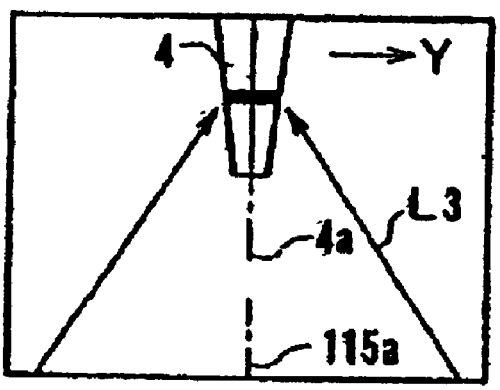
FIGS. 13A through 13E are explanatory diagrams of the images of the tool used in the fourth embodiment.
Figure 13B:
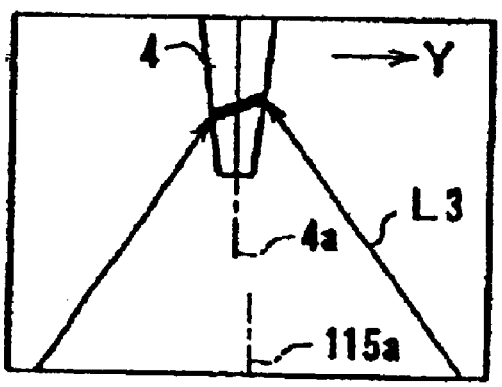
Figure 13D:
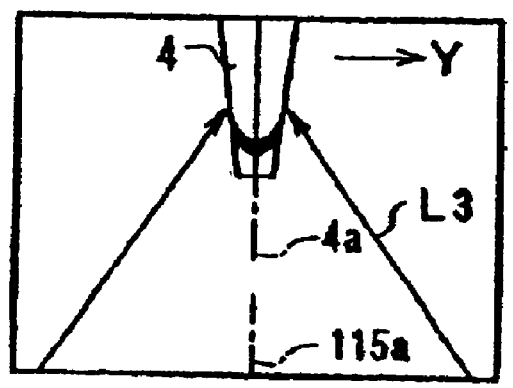
Figure 13C:
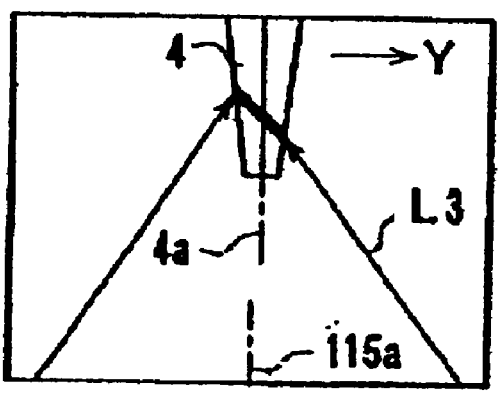
Figure 13E:
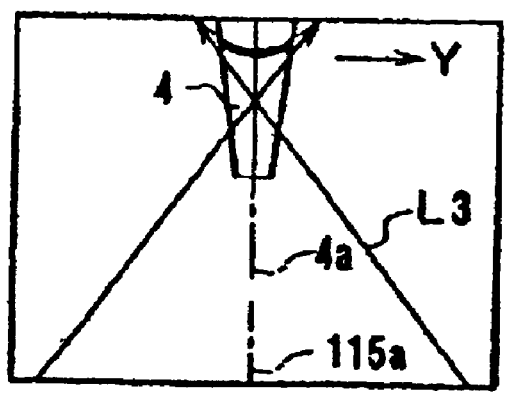

The image that is obtained by the imaging of the tool 4 differs according to the position of the axial center 4a of the tool 4. In a case where the center 115a of the ring-form light source 115 and the axial center 4a of the tool 4 coincide, the image obtained is as shown in FIG. 13A. In a case where the axial center 4a of the tool 4 is shifted in the Y direction, the image obtained is as shown in FIG. 13B. In a case where this axial center 4a is shifted in the −Y direction, the image obtained is as shown in FIG. 13C. In a case where the axial center 4a is shifted in the −X direction, the image obtained is as shown in FIG. 13D, and in a case where the axial center 4a is shifted in the X direction, the image obtained is as shown in FIG. 13E. In this fourth embodiment, the position of the tool 4 can be accurately determined based upon the variations in such images.

Figure 14:
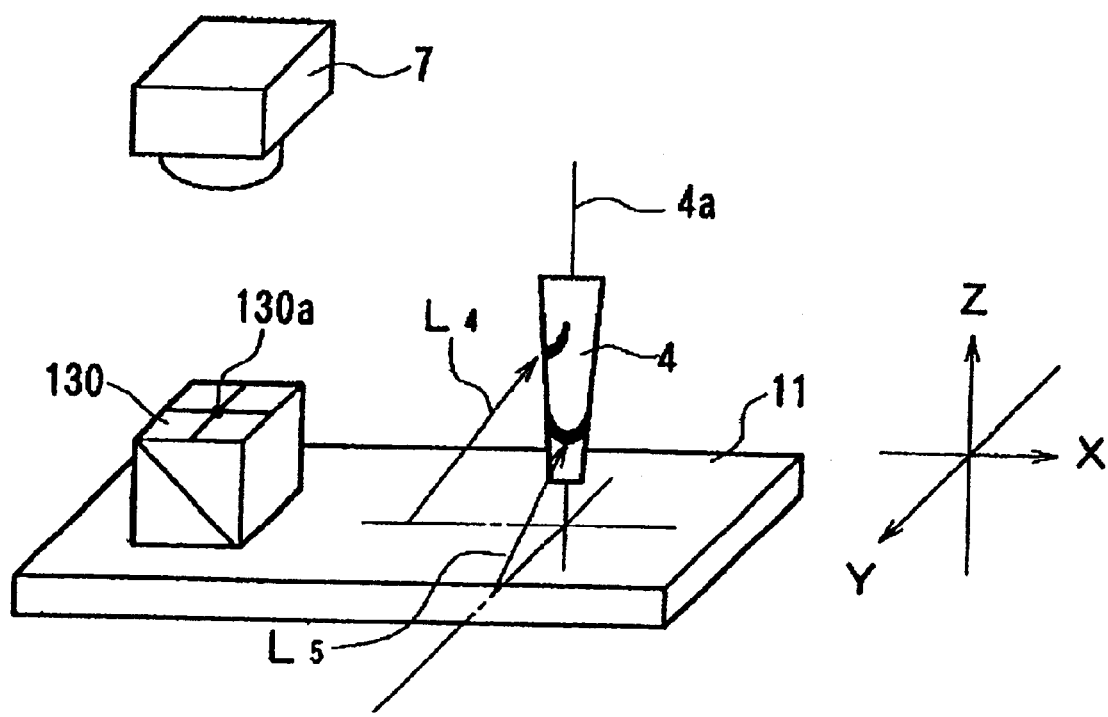
FIG. 14 is a perspective view of the essential portion of the fifth embodiment of the present invention.

FIG. 14 shows the fifth embodiment of the present.

In this fifth embodiment, horizontal line-form reference patterns $L_4$ and $L_5$ similar to the reference pattern shown in FIG. 3B are projected on the tool 4 from both the X and Y directions as in the second embodiment. The fifth embodiment differs from the second embodiment in that the direction of projection is inclined upward. In FIG. 14, the light source is omitted.

Figure 15A:
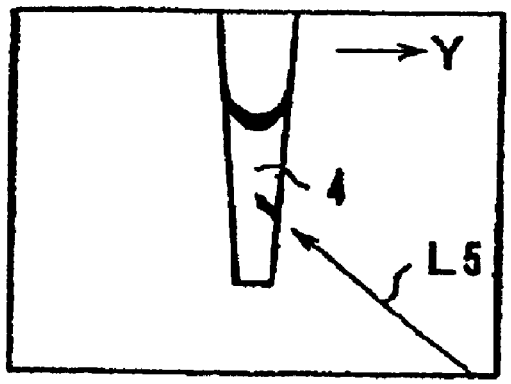
FIGS. 15A through 15E are explanatory diagrams of the images of the tool used in the fifth embodiment.
Figure 15B:
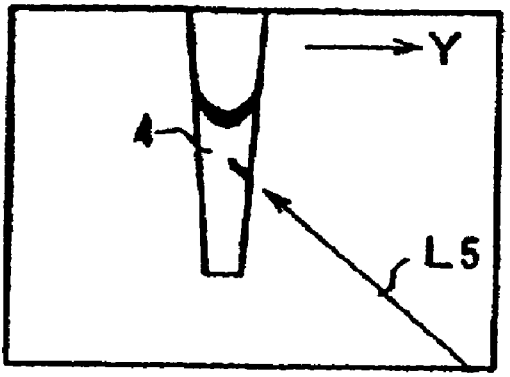
Figure 15C:
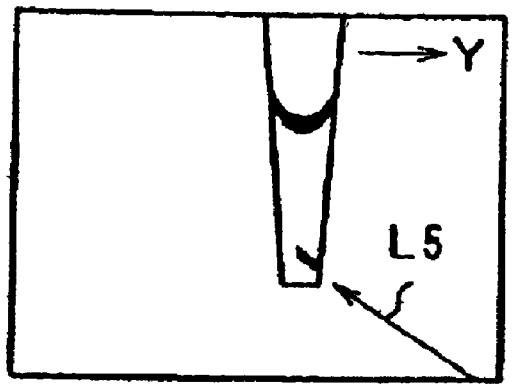
Figure 15D:
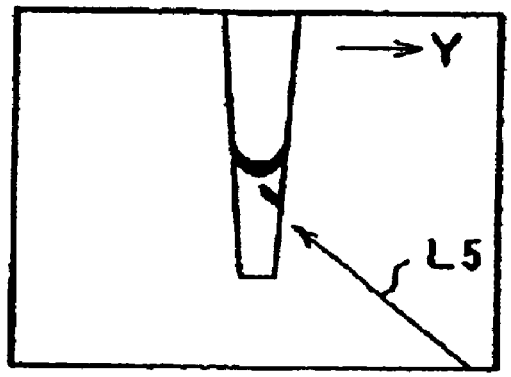
Figure 15E:
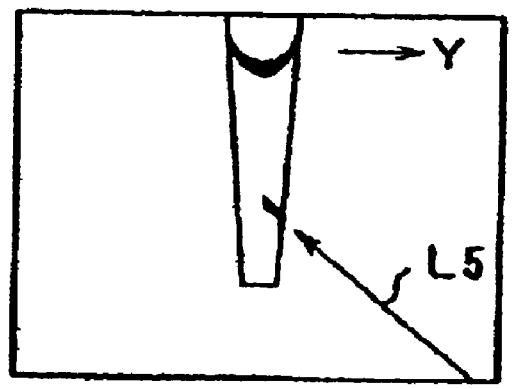

The image that is obtained by the imaging of the tool 4 in the fifth embodiment differs according to the position of the axial center 4a of the tool 4. In a case where the axial center 4a of the tool 4 is in the imaging reference position, the image obtained is as shown in FIG. 15A. When the axial center 4a of the tool 4 is shifted in the Y direction, the image obtained is as shown in FIG. 15B, and when the axial center 4a of the tool 4 is shifted in the −Y direction, the image obtained is as shown in FIG. 15C. Furthermore, when the axial center 4a is shifted in the −X direction, the image obtained is as shown in FIG. 15D, and when the axial center 4a is shifted in the X direction, the image obtained is as shown in FIG. 15E. In the fifth embodiment, the position of the tool 4 can be accurately determined based upon the variations in such images.

In each of the embodiments described above, the processing member is a single tool 4. However, the present invention can be used to measure the offset amounts between a plurality of working head devices and the position detection imaging device and to measure the offset amounts among such a plurality of working head devices.

Furthermore, the described embodiments, the prisms 18 and 130 are used. However, the optical members used in the present invention may have any construction that is capable of conducting image light from the processing member and reference member (or reference mark) to the position detection imaging device. For example, it is possible to use optical fibers which are disposed so as to face the processing member at different angles. Furthermore, in the above embodiments, the imaging device is a camera. The imaging device used in the present invention, however, may have any structure that is capable of detecting light. For instance, a line sensor can be used. In addition, the embodiments of the present invention are described with reference to a wire bonding apparatus. However, it goes without saying that the present invention is applicable to various other types of bonding apparatuses such as die bonding apparatuses, tape bonding apparatuses, and flip-chip bonding apparatuses.

What is claimed is:

1. An offset measurement method in a processing apparatus which comprises:
    a position detection imaging device that images an object to be processed, and
    a tool which is installed so as to be offset with respect to said position detection imaging device and processes said object to be processed,
    said offset measurement method comprising:
        a step of projecting a reference pattern toward said tool at a specified angle of inclination with respect to a measurement direction from a light source that is disposed in a specified position,
        a step of measuring a position of said tool based upon said reference pattern projected on said tool,
        a step of measuring a position of said position detection imaging device, and
        a step of determining an amount of offset between said position detection imaging device and said tool based upon results of said steps of measuring; and wherein
            said step of measuring said position of said position detection imaging device is accomplished by imaging a specified reference point with said position detection imaging device,
            said reference point is a reference member which is disposed in a specified position,
            said step of projecting and said step of measuring of said position of said tool are both accomplished in an attitude in which said tool is caused to approach said reference member, and
            said step of determining said amount of offset further includes a step of specifying amounts of movement of said position detection imaging device and said tool between an attitude in which said position of said tool is measured and an attitude in which said reference point is imaged by said position detection imaging device.

2. The offset measurement method according to claim 1, wherein
  said step of projecting said reference pattern is performed by projecting said reference pattern on both said tool and said reference member from said light source, and
  said step of measuring said position of said tool is accomplished based upon image light from both said tool and said reference member.

3. The offset measurement method according to claim 2, wherein said step of measuring said position of said tool includes a step for conducting image light from said tool and said reference member to said position detection imaging device.

4. The offset measurement method according to claim 1, wherein said step of measuring said position of said tool includes a step for conducting image light from said tool and said reference member to said position detection imaging device.

* * * * *